(12) United States Patent
Bucsa et al.

(10) Patent No.: US 9,488,683 B2
(45) Date of Patent: Nov. 8, 2016

(54) DIGITAL CIRCUIT AND METHOD FOR MEASURING AC VOLTAGE VALUES

(71) Applicant: Tyco Safety Products Canada Ltd., Concord (CA)

(72) Inventors: Andrei Bucsa, Toronto (CA); Stephen D. W. Fosty, Brampton (CA)

(73) Assignee: TYCO SAFETY PRODUCTS CANADA LTD., Concord (CA)

( * ) Notice: Subject to any disclaimer, the term of this patent is extended or adjusted under 35 U.S.C. 154(b) by 66 days.

(21) Appl. No.: 13/630,986

(22) Filed: Sep. 28, 2012

(65) Prior Publication Data

US 2013/0158924 A1 Jun. 20, 2013

Related U.S. Application Data

(60) Provisional application No. 61/577,303, filed on Dec. 19, 2011.

(51) Int. Cl.
| | |
|---|---|
| *G01R 23/02* | (2006.01) |
| *G06F 17/00* | (2006.01) |
| *H02J 7/00* | (2006.01) |
| *G01R 19/00* | (2006.01) |
| *H02H 3/087* | (2006.01) |
| *F16H 59/10* | (2006.01) |
| *G01D 5/245* | (2006.01) |
| *G01B 7/00* | (2006.01) |
| *G01B 7/14* | (2006.01) |
| *H02H 3/06* | (2006.01) |

(52) U.S. Cl.
CPC .............. *G01R 23/02* (2013.01); *G01R 19/00* (2013.01); *G06F 17/00* (2013.01); *H02H 3/087* (2013.01); *H02J 7/0068* (2013.01); *F16H 59/105* (2013.01); *G01B 7/003* (2013.01); *G01B 7/14* (2013.01); *G01D 5/2457* (2013.01); *H02H 3/06* (2013.01)

(58) Field of Classification Search
CPC ............ H01F 2007/1866; H01F 7/18; H01F 7/1844; H02K 41/03; H02P 25/027; H02P 23/0045; H02P 7/288; H02P 7/298; H02P 9/04; H02P 9/30; H02P 9/302; H02P 9/36; H01H 47/325; G01R 23/02; G01R 19/00
USPC ................ 219/497; 361/160, 154, 18, 21, 6; 315/224, 307; 322/28, 73, 32; 320/163; 323/259; 327/58, 62; 702/78; 714/47.1, 714/745
See application file for complete search history.

(56) References Cited

U.S. PATENT DOCUMENTS

| | | | |
|---|---|---|---|
| 3,984,755 A * | 10/1976 | Lehnhoff et al. | ................ 322/28 |
| 5,602,462 A * | 2/1997 | Stich et al. | ................... 323/258 |
| 7,924,584 B1 * | 4/2011 | Notohamiprodjo et al. | ... 363/79 |
| 2008/0252337 A1 * | 10/2008 | Uribe et al. | .................... 327/60 |
| 2009/0228224 A1 * | 9/2009 | Spanier et al. | ................. 702/60 |

* cited by examiner

OTHER PUBLICATIONS

Merriam-Webster Dictionary, Definition of "average".*

*Primary Examiner* — Regis Betsch
*Assistant Examiner* — Lisa Peters

(57) ABSTRACT

An AC measurement circuit includes a rectifier for receiving an AC signal; a peak detection circuit; and a voltage divider, interconnected with an output of the rectifier, and the input of the peak detection circuit to provide the peak detection circuit with a voltage value equal to a fraction of the AC signal. An analog to digital converter, has its analog input interconnected with an output of the peak detection circuit, for providing a digital output corresponding to its analog input. A summing circuit sums n samples of the digital output. The voltage divider is configured so that the summing circuit calculates an average measurement of the AC signal by summing n samples and without floating point division.

16 Claims, 4 Drawing Sheets

DIGITAL CIRCUIT AND METHOD FOR MEASURING AC VOLTAGE VALUES

CROSS-REFERENCE TO RELATED APPLICATIONS

The present application claims priority from U.S. Provisional Patent Application No. 61/577,303, filed Dec. 19, 2011, the contents of which are hereby incorporated herein by reference.

FIELD OF THE INVENTION

The present invention relates generally to signal measurement, and more particularly to a digital AC voltage measurement device and method.

BACKGROUND OF THE INVENTION

Many practical applications require the measurement of AC signal metrics. Typical metrics of interest include peak and root mean square voltage measurements of AC signals.

For example, alarm systems and universal power supplies monitor input voltages to ensure they do not deviate significantly. Certain measuring equipment used by technicians similarly measures AC voltages. Often a digital representation of such measurements is advantageous, as the digital representation can be further processed, or more clearly presented.

Unfortunately, determining a digital value corresponding to a measured AC voltage often requires floating point calculations (e.g. division). This, in turn, requires certain processing abilities and accuracies.

As such, simplified circuits and associated methods for measuring AC voltage metrics, and in particular AC RMS voltages are desired.

SUMMARY OF THE INVENTION

Exemplary of an embodiment of the present invention, an AC measurement circuit includes a rectifier for receiving an AC signal; a peak detection circuit; and a voltage divider, interconnected with an output of the rectifier, and the input of the peak detection circuit to provide the peak detection circuit with a voltage value equal to a fraction of the AC signal. An analog to digital converter, has its analog input interconnected with an output of the peak detection circuit, for providing a digital output corresponding to its analog input. A summing circuit sums n samples of the digital output. The voltage divider is configured so that the summing circuit calculates an average measurement of the AC signal by summing n samples and without requiring floating point division.

In a further embodiment, a method of measuring an AC input voltage, includes providing the AC signal to a rectifier to provide a rectified output; providing the rectified output to the input of a voltage divider that outputs a fraction of the rectified output; detecting a peak of the output of the voltage divider over time; sampling the peak of the output at an analog to digital converter to produce a digital value; and summing n of the digital values. The voltage divider is configured so that an average measurement of the AC signal is calculated by summing the n of the digital values without requiring floating point operations (e.g. division).

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
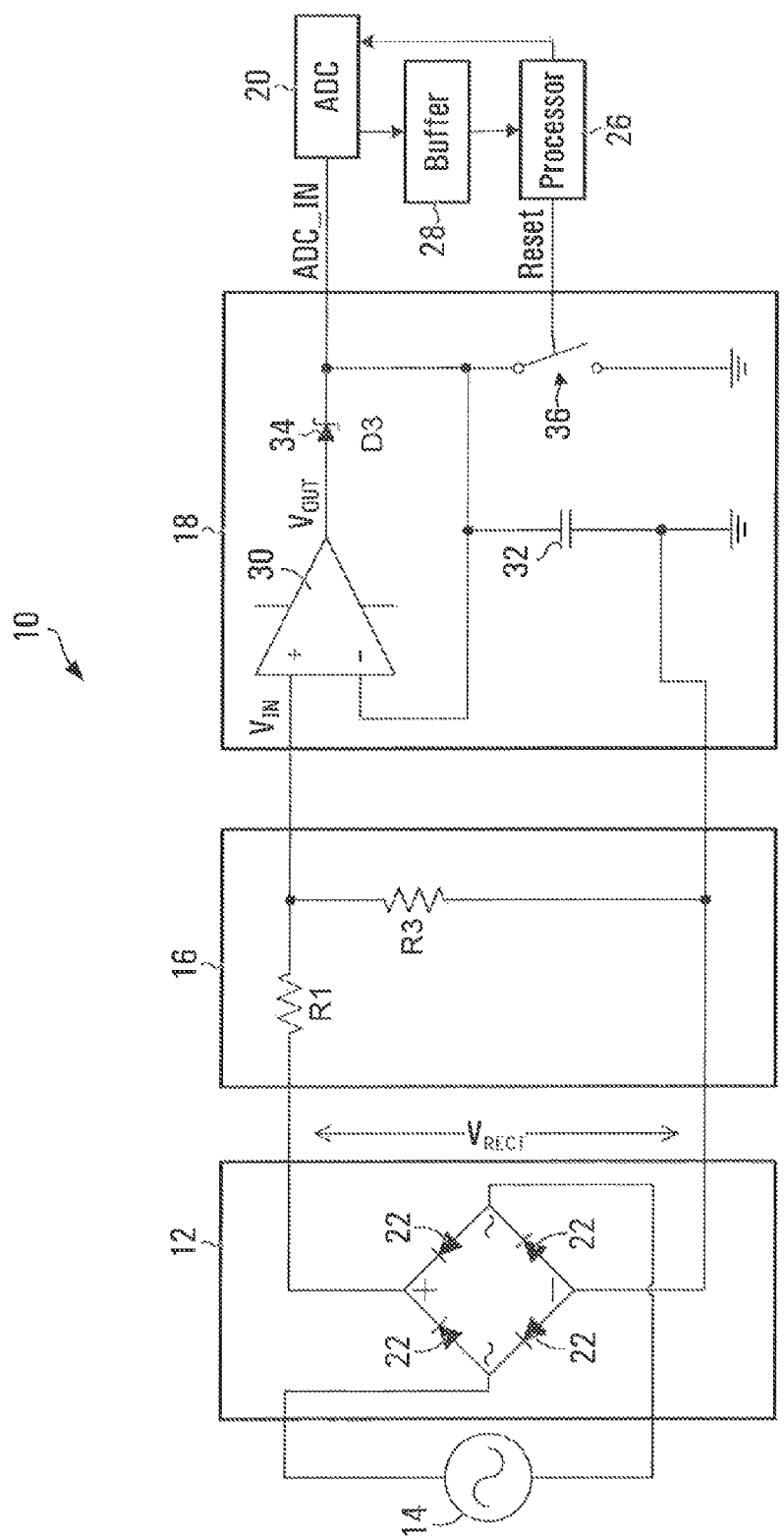
FIG. 1 is a block diagram of an AC voltage measurement circuit exemplary of an embodiment of the present invention.

FIG. 1 illustrates an AC voltage measurement circuit 10 exemplary of an embodiment of the present invention. As illustrated, circuit 10 includes a bridge rectifier 12, formed of four diodes 22, feeding a voltage divider 16 that feeds a peak detection circuit 18 that provides an output $V_{ADC}$ to an analog to digital converter (ADC) 20. ADC 20 is in communication with processor 26. Processor 26 causes ADC 20 to periodically sample the analog output provided by peak detection circuit 18. Upon sampling, a digital value representing the sampled voltage is output and stored in buffer 28.

Figure 2:
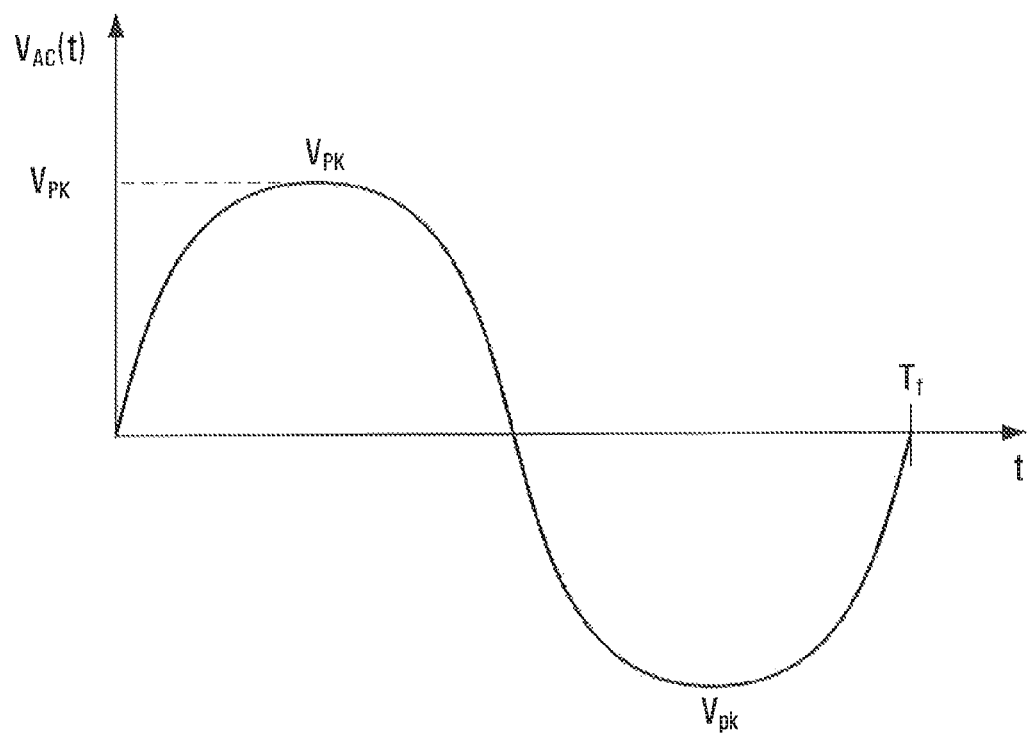
FIG. 2 illustrates a waveform of an AC voltage to be measured by the measurement circuit of FIG. 1.
Figure 3:
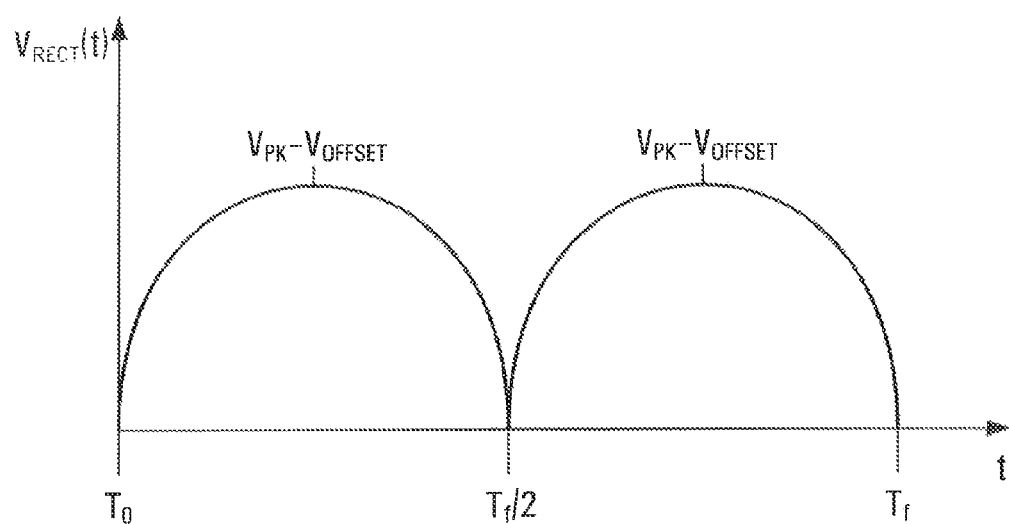
FIG. 3 illustrates a waveform of a rectified voltage formed by the measurement circuit of FIG. 1.

Bridge rectifier 12 receives a sinusoidal AC voltage, $V_{AC}(t)$, from source 14 as depicted in FIG. 2 and produces a full wave rectified output $V_{RECT}(t)$ as depicted in FIG. 3. Rectifier 12 introduces a voltage drop, $V_{OFFSET}$, across diodes 22.

Voltage divider 16 further presents a fraction of the rectified voltage to the input of peak detection circuit 18, to present $$V_{IN} = \frac{R_3}{R_1 + R_3} \cdot V_{RECT}.$$

Peak detection circuit 18 detects the peak of any voltage presented at its input (i.e. the peak of $V_{RECT}$). Peak detection circuit 18 may be formed as an operational amplifier 30, having its inverting input connected in feedback, a capacitor 32 connected to ground at the inverting input, to store any applied voltage and provide output voltage $V_{IN\_PK}(t)$. A diode 34 may prevent current from flowing back into the output of amplifier 30 and discharging capacitor 32. Peak detection circuit 18 tracks the peak voltage presented at its input by charging capacitor 32, until reset. Reset may be accomplished through switch 36 that discharges capacitor 32.

The output $V_{IN\_PK}(t)$ of peak detection circuit 18 is provided to the input of an analog to digital converter (ADC) 20. ADC 20 may be a standard analog to digital converter, providing an 8, 16, or 32 (or other) bit digital output corresponding to a sampled value at its input, in an embodiment, the digital output of ADC 20 feeds a buffer 28. Buffer 28 may be an n location circular buffer.

Buffer 28 may be in communication with a summing circuit, which may be part of a processor 26 such as a microcontroller, digital signal processor (DSP) or other processor. Processor 26 may sum samples provided by ADC 20 stored in buffer 28. ADC 20 may also be part of the processor/microcontroller and the microcontroller would perform the summing function. Processor 26 may include, or be otherwise in communication with, suitable memory for storing program instructions, and samples. Buffer 28 may be formed in such memory.

The input of peak detection circuit 18, $V_{IN}(t)$ may not have the same range as $V_{AC}(t)$ provided by source 14. For example, peak detection circuit 18 may have an operating range of less than 5 V, while source 14 may provide a 16, 18 or 120 $V_{AC}$ signal.

Voltage divider 16, as such, reduces the voltage provided to peak detection circuit 18. Thus, the input to peak detection circuit 18 may be determined as a fraction of $V_{RECT}$, that is $V_{IN} = \eta \cdot V_{RECT}$. Accounting for the voltage drop across diodes 22, $V_{IN}(t) = \eta \cdot (V_{AC}(t) - V_{OFFSET})$. $V_{PK}$ is the peak voltage of $V_{AC}(t)$, provided by source 14. Thus, $V_{IN\_PK} = \eta \cdot (V_{PK} - V_{OFFSET})$.

ADC 20 may be continuously provided the output of peak detection circuit 18. Under control of processor 26, ADC 28 samples this output, $V_{IN_{PK}}[i]$. Typically, the sampling interval will exceed half of the period of $V_{IN}(t)$ to be sampled. As such, the output of peak detection circuit 18 should provide the peak of $V_{IN}(t)$ in each half period of $V_{IN}(t)$ regardless of sampling phase. After each sample, peak detection circuit 18 may be reset by processor 26 discharging capacitor 32—for example by way of a switch 36 to ground in parallel with capacitor 32.

The sampled values may be used to calculate an average measurement of $V_{PK}$, $V_{PK\_AVG}$ as detailed below.

To do so, circuit 10 relies on the observation that $$\text{ADC\_OUT}_{AVG} = \eta \cdot \sum_{i=1}^{n} \frac{V_{PK}[i]}{n} - \eta \cdot \sum_{i=1}^{n} \frac{V_{OFFSET}[i]}{n} = \qquad (1)$$

$$\eta \cdot \sum_{i=1}^{n} \frac{V_{PK}[i]}{n} - \frac{\eta}{n} \cdot \sum_{i=1}^{n} V_{OFFSET}[i] =$$

$$\eta \cdot \sum_{i=1}^{n} \frac{V_{PK}[i]}{n} - \frac{\eta}{n} \cdot n \cdot V_{OFFSET} = \eta \cdot \sum_{i=1}^{n} \frac{V_{PK}[i]}{n} - \eta \cdot V_{OFFSET}$$

$V_{OFFSET}$ (the drop across diodes 22) can be considered constant, so, $$V_{OFFSET} = V_{OFFSET}[1] = V_{OFFSET}[2] = \ldots = V_{OFFSET}[n] \qquad (2)$$

Now, the digital average of n samples, $\text{ADC\_OUT}_{AVG}$ (for n samples) is defined as:

$$\text{ADC\_OUT}_{AVG} = \sum_{i=1}^{n} \frac{\text{ADC\_OUT}[i]}{n} \qquad (3)$$

This means:

$$\frac{1}{n} \cdot \sum_{i=1}^{n} \text{ADC\_OUT}[i] = \eta \cdot \sum_{i=1}^{n} \frac{V_{PK}[i]}{n} - \eta \cdot V_{OFFSET} \qquad (4)$$

The average of $V_{PK}$, $V_{PK\_AVG}$ is defined as $$V_{PK\_AVG} = \sum_{i=1}^{n} \frac{V_{PK}[i]}{n} \qquad (5)$$

Dividing the both sides of equation (4) by $\eta$ yields, $$\frac{1}{n \cdot \eta} \cdot \sum_{i=1}^{n} \text{ADC\_OUT}[i] = V_{PK\_AVG} - V_{OFFSET} \qquad (6)$$

or $$V_{PK\_AVG} = \frac{1}{n \cdot \eta} \cdot \sum_{i=1}^{n} \text{ADC\_OUT}[i] + V_{OFFSET} \qquad (7)$$

or:

$$V_{PK\_AVG} = \qquad (8)$$
$$\frac{1}{n \cdot \eta} \cdot (\text{ADC\_OUT}[1] + \text{ADC\_OUT}[2] + \ldots + \text{ADC\_OUT}[n]) + V_{OFFSET}$$

This allows calculation of RMS voltages as:

$$V_{RMS\_AVG} = \qquad (9)$$
$$\frac{V_{PK\_AVG}}{\sqrt{2}} = \frac{1}{\sqrt{2} \cdot n \cdot \eta} \cdot (\text{ADC\_OUT}[1] + \text{ADC\_OUT}[2] + \ldots + \text{ADC\_OUT}[n]) + V_{OFFSET}$$

Now, by selecting $$\frac{1}{\sqrt{2} \cdot n \cdot \eta}$$

to equal or approximate integer, e.g.

$$\frac{1}{\sqrt{2} \cdot n \cdot \eta} = 1 \qquad (10)$$

or:

$$\eta = \frac{1}{\sqrt{2} \cdot n}, \text{ yields} \qquad (11)$$

$$V_{RMS\_AVG} = \qquad (12)$$
$$(\text{ADC\_OUT}[1] + \text{ADC\_OUT}[2] + \ldots + \text{ADC\_OUT}[n]) + V_{OFFSET}$$

Thus, if RMS voltage is to be measured, $$\frac{1}{\sqrt{2} \cdot n \cdot \eta},$$

may be chosen to equal an integer (e.g. 1) to avoid floating point division.

That is, by so choosing n and $\eta$, only addition is required to calculate the average because of the resistor divider ratio of voltage divider 16.

$\eta$ may further be selected to accommodate the maximum input voltage at the input of ADC 20 in order to maximize the dynamic range of the measurement and maximize measurement resolution. This means, the maximum peak voltage at the input $V_{PK}$, after division should be close to the maximum range of the ADC 20 which measures the peak voltage.

Now, n, is the number of samples to be taken to determine the average voltage. A suitable value for n may be chosen based on the input voltage range to be measured.

For example n may be chosen, so that $$n = \left\lceil \frac{V_{PK}}{V_{ADC\_DYNAMIC\_RANGE}} \right\rceil$$

where $V_{PK}$ is the maximum peak expected value of voltage source 14 $V_{AC}$, $V_{ADC\_DYNAMIC\_RANGE}$ is the dynamic range of ADC 20, which should not exceed the dynamic range of peak detection circuit 18 (e.g. the peak desired voltage value of the input to peak detection circuit 18, without clipping or distortion), and $\lceil \ \rceil$ represents the ceiling function (i.e. $\lceil x \rceil \min\{n \in Z | n \geq x\}$.

Now, $V_{OFFSET}$ introduced by diodes 22 may be calibrated and stored. Thereafter, the past n samples of the AC RMS or AC peak voltage may be continuously averaged, as described above. $V_{OFFSET}$ can be a constant in the processor memory that is added to ADC_OUT$_{AVG}$. To allow averaging of the past n samples of peak detection circuit 18, buffer 28 may be a circular buffer. After each sample, the circular buffer may be advanced, and thus store the previous n samples of ADC 20, with the n+1$^{st}$ sample replacing the 1$^{st}$ sample in the buffer. This would allow constant averaging at each AC half cycle, using the past n samples, independent of the choice of n. As noted, the buffer 28 may be formed in memory used by the described processor 26.

For example: if $V_{AC}(t)$ provided by source 14 is an 18 volts AC (RMS) input signal with a 15% overvoltage, the maximum input voltage would be 20.7 $V_{AC(RMS)}$. $V_{PK}$ of 20.7 $V_{AC(RMS)}$=20.7*$\sqrt{2}$=29.274 V. Assuming ADC 20 has a dynamic range of 2.8 volts, the number of samples n may be chosen as:

$$n = \left\lceil \frac{29.274}{2.8 \cdot \sqrt{2}} \right\rceil = 8$$

This then allows choice of $\eta$, the resistor divider ratio for peak detection circuit 18, as:

$$\eta = \frac{1}{\sqrt{2} \cdot n} = 0.088388$$

Thus the resistor divider ratio would be 1:11.3137 and the voltage across R$_3$ would be related to the ratio $\eta$=R$_3$/(R$_1$+R$_3$)=0.088388.

Because of this resistor divider ratio, only eight samples of peak detection circuit 18 need to be added to produce the RMS voltage to be measured. Correspondingly, a sample and hold buffer need only store eight samples.

Conveniently, averaging the voltage value over "n" samples (RMS or peak) reduces any instantaneous errors. It further compensates the voltage drop across rectifier 12, thereby providing greater accuracy.

Conveniently, the calculation requires only summing, and thus allows for quick AC voltage evaluation without requiring division, shifts, or floating point calculations. Further, sampling interval/period of ADC 20 need not be overly precise—peak detection circuit 18, instead, ensures that peak values are sampled. Sampling and averaging can be performed only once every half period, and averaging can be performed at the same frequency. The described technique is also tolerant to jitter and further the effective measurement dynamic range of ADC 20 may be adjusted/maximized by $\eta$—that is, the resistor divider ratio of voltage divider 16 can be chosen to accommodate a different input voltage range.

Figure 4:
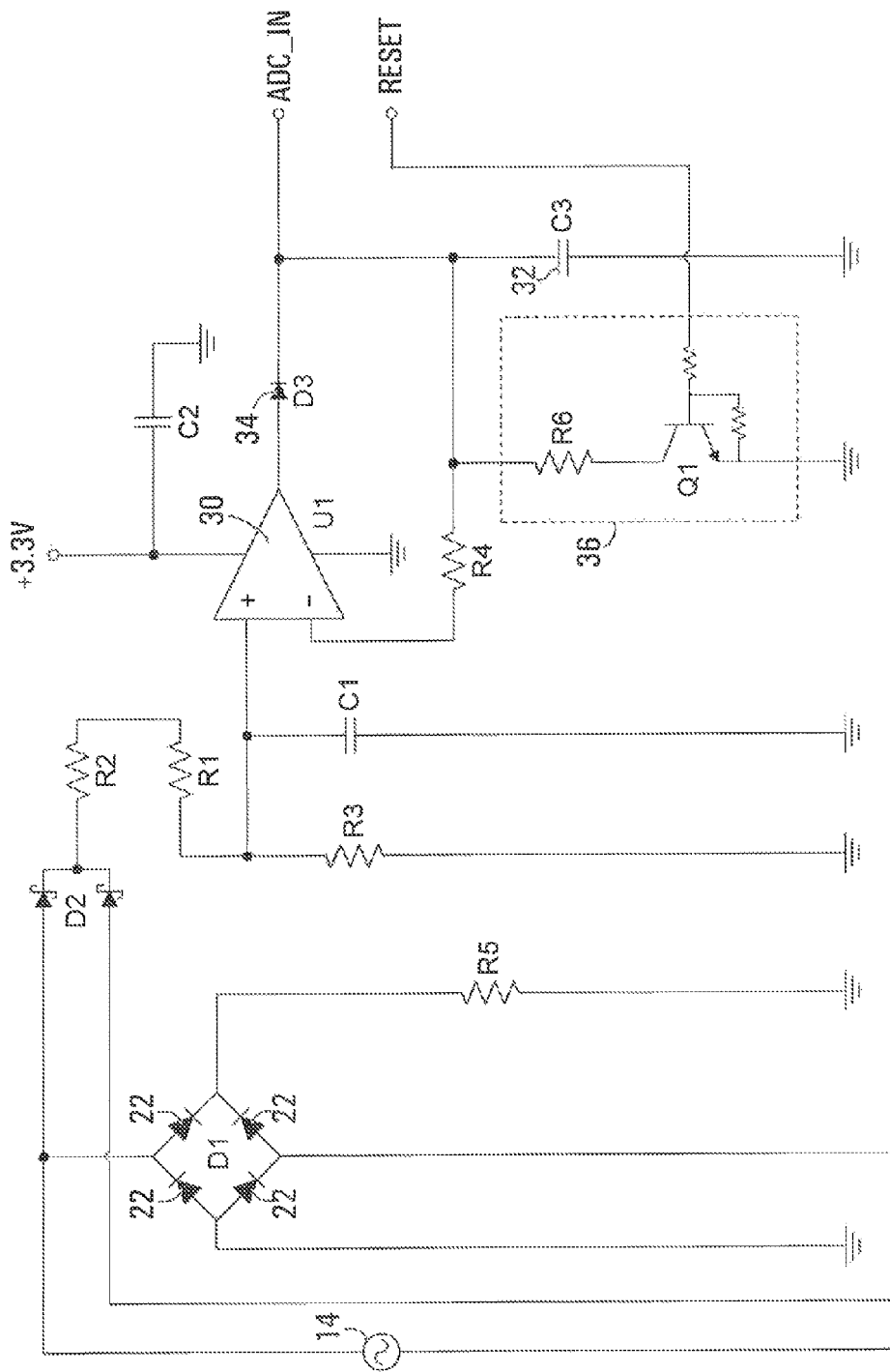
FIG. 4 is a schematic diagram of an AC voltage measurement circuit exemplary of an embodiment of the present invention.

An example, circuit 10 may be formed as depicted in FIG. 4. ADC 20 has been omitted. D2 formed of two Schottky diodes provides a better full-wave rectified signal as shown in FIG. 3, and improves peak detection. The voltage drop across D2 may be considered constant because the load it sees is very light. The offset voltage of D1—diode 22—is not constant because the load provided by R5 can vary thus varying the offset value. The only effect of the offset voltage of D2 would be temperature. R2 is used to trim the value to as accurate a division ratio as possible. C1 provides a low-pass filter the remove any high frequency noise. R4 compensates the positive biasing of 30 (R4 resistance should be equal with the equivalent impedance of resistive divider which feeds the operational amplifier positive input). R5 depicts the circuit load. C2 is a bypass capacitor for the power pin of op-amp 30. C3 is a low leakage holding capacitor which holds the peak value of the input voltage $V_{IN\_PK}$.

Many variations to the circuit of FIGS. 1 and 4 are possible. For example, R1, R2 and R3 may be replaced with an adjustable potentiometer with the wiper connected to the positive input of operational amplifier 30. R1, R2 and R3 could also be replaced with a digital potentiometer and calibrated electronically at the time of testing.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. An AC measurement circuit to provide an average measurement of an AC signal, the circuit comprising:
   a rectifier for receiving said AC signal and providing a rectified output, the AC signal having an expected voltage range;
   a peak detection circuit for detecting peak values of an input voltage;
   an analog to digital converter, having its analog input interconnected with an output of said peak detection circuit, for providing a digital output corresponding to detected peak values of said input voltage and to provide n samples of said digital output, n having been selected based on a ratio of the maximum peak value of said expected voltage range and the dynamic range of said analog input;
   a voltage divider, interconnected with an output of said rectifier, and the input of said peak detection circuit to provide said peak detection circuit with said input voltage equal to a fraction of said rectified output, said fraction being a reciprocal of a multiple of n; and
   a processing circuit to calculate said average measurement of said AC signal by summing said n samples of said digital output.

2. The AC measurement circuit of claim 1, wherein said processing circuit calculates said average measurement without floating point operation.

3. The AC measurement circuit of claim 1, wherein said average measurement is an average root mean square measurement of the voltage of said AC signal, said fraction equals η, and wherein η and n are chosen so that the ratio $$\frac{1}{\sqrt{2}\cdot n\cdot \eta}$$

approximates an integer.

4. The AC measurement circuit of claim 1, wherein said average measurement is an average peak voltage measurement of said AC signal, said fraction equals η, and wherein η and n are chosen so that the ratio $$\frac{1}{n\cdot \eta}$$

approximates an integer.

5. The AC measurement circuit of claim 1, wherein said processing circuit is calibrated to account for any voltage drop across said rectifier.

6. The AC measurement circuit of claim 1, further comprising a circular buffer in communication with said analog to digital converter to store said n samples of said digital output.

7. The AC measurement circuit of claim 6, wherein said processing circuit sums values stored in said circular buffer.

8. The AC measurement circuit of claim 1, wherein said processing circuit and said analog to digital converter form part of a processor.

9. A method of determining an average measurement of an AC signal, the method comprising:
   providing said AC signal to a rectifier to provide a rectified output, the AC signal having an expected voltage range;
   providing said rectified output to the input of a voltage divider that outputs a fraction of said rectified output;
   detecting a peak of said output of said voltage divider over time;
   sampling said peak of said output at an analog to digital converter to produce at least n digital values, n having been selected based on a ratio of the maximum peak value of said expected voltage range and the dynamic range of said analog input;
   summing n of said digital values to calculate said average measurement of said AC signal by at least one processor;
   wherein said voltage divider is configured so that said fraction is a reciprocal of a multiple of n.

10. The method of claim 9, wherein said average measurement of said AC signal is calculated without floating point operations.

11. The method of claim 9, wherein said detecting said peak, said sampling and said summing are repeated.

12. The method of claim 9, wherein said average measurement is an average root mean square measurement of the voltage of said AC signal, said fraction equals η, and wherein η and n are chosen so that the ratio $$\frac{1}{\sqrt{2}\cdot n\cdot \eta}$$

approximates an integer.

13. The method of claim 9, wherein said average measurement is an average peak voltage measurement of said AC signal, said fraction equals η and wherein η and n are chosen so that the ratio $$\frac{1}{n\cdot \eta}$$

approximates an integer.

14. The method of claim 9, wherein said summing accounts for any voltage drop across said rectifier.

15. The method of claim 9, wherein said n of said digital values are stored in a circular buffer.

16. The method of claim 14, wherein said summing n of said digital values by at least one processor comprises summing values stored in said circular buffer.

* * * * *